United States Patent [19]

Edelstein et al.

[11] Patent Number: 4,680,548
[45] Date of Patent: Jul. 14, 1987

[54] RADIO FREQUENCY FIELD COIL FOR NMR

[75] Inventors: William A. Edelstein; John F. Schenck, both of Schenectady; Otward M. Mueller, Ballston Lake, all of N.Y.; Cecil E. Hayes, Wauwatosa, Wis.

[73] Assignee: General Electric Company, Milwaukee, Wis.

[21] Appl. No.: 884,674

[22] Filed: Jul. 16, 1986

Related U.S. Application Data

[63] Continuation of Ser. No. 659,043, Oct. 9, 1984, abandoned.

[51] Int. Cl.$^4$ ............................................. G01R 33/20
[52] U.S. Cl. ..................................... 324/318; 324/322
[58] Field of Search ............... 324/300, 307, 309, 316, 324/318, 322; 333/219, 220, 221

[56] References Cited

U.S. PATENT DOCUMENTS

| | | | |
|---|---|---|---|
| 3,603,871 | 9/1971 | Caunter et al. | 324/322 |
| 3,771,055 | 11/1973 | Anderson | 324/322 |
| 4,052,661 | 10/1977 | Higham et al. | 324/322 |
| 4,450,408 | 5/1984 | Tiemann | 324/318 |
| 4,506,224 | 3/1985 | Krause | 324/300 |
| 4,545,384 | 10/1985 | Kawachi | 324/309 |
| 4,563,648 | 1/1986 | Hill | 324/318 |
| 4,581,580 | 4/1986 | Keim | 324/318 |
| 4,594,566 | 6/1986 | Maudsley | 324/318 |
| 4,607,225 | 8/1986 | Crooks | 324/318 |

FOREIGN PATENT DOCUMENTS

| | | | |
|---|---|---|---|
| 60346 | 4/1984 | Japan | 324/307 |
| 461844 | 10/1968 | Switzerland | 324/322 |

OTHER PUBLICATIONS

European Patent 0 141 383, May 1985.

Primary Examiner—Michael J. Tokar
Attorney, Agent, or Firm—Douglas E. Stoner

[57] ABSTRACT

In one embodiment, referred to as the "high-pass" version, the radio frequency (RF) coil is made up of two conductive loop elements, each including serially-connected capacitors. The loop elements are electrically interconnected by axial conductive segments having inherent inductances associated therewith. Electrically, the coil can be viewed as a slow wave delay line structure wrapped around a cylinder and connected to itself. The coil can be energized by connecting a source of RF power across one of the capacitors in the loop elements. In another embodiment, termed the "band-pass" version, the axial conductive segments, as well as the conductive loop elements, are provided with capacitors.

17 Claims, 20 Drawing Figures

RADIO FREQUENCY FIELD COIL FOR NMR

This application is a continuation of application Ser. No. 659,043, filed Oct. 9, 1984, abandoned.

CROSS REFERENCE TO RELATED PATENT APPLICATION

This patent application is related to commonly assigned patent application Ser. No. 548,745 filed by Cecil E. Hayes on Nov. 4, 1983 entitled "Radio Frequency Coil for NMR," which application is incorporated herein by reference.

BACKGROUND OF THE INVENTION

This invention relates to nuclear magnetic resonance (NMR) apparatus. More specifically, this invention relates to radio frequency (RF) coils useful with such apparatus for transmitting and/or receiving RF signals.

In the past, the NMR phenomenon has been utilized by structural chemists to study, in vitro, the molecular structure of organic molecules. Typically, NMR spectrometers utilized for this purpose were designed to accommodate relatively small samples of the substance to be studied. More recently, however, NMR has been developed into an imaging modality utilized to obtain images of anatomical features of live human subjects, for example. Such images depicting parameters associated with nuclear spins (typically hydrogen protons associated with water in tissue) may be of medical diagnostic value in determining the state of health of tissue in the region examined. NMR techniques have also been extended to in vivo spectroscopy of such elements as phosphorus and carbon, for example, providing researchers with the tools, for the first time, to study chemical processes in a living organism. The use of NMR to produce images and spectroscopic studies of the human body has necessitated the use of specifically designed system components, such as the magnet, gradient and RF coils.

By way of background, the nuclear magnetic resonance phenomenon occurs in atomic nuclei having an odd number of protons or neutrons. Due to the spin of the protons and neutrons, each such nucleus exhibits a magnetic moment, such that, when a sample composed of such nuclei is placed in a static, homogeneous magnetic field, $B_o$, a greater number of nuclear magnetic moments align with the field to produce a net macroscopic magnetization M in the direction of the field. Under the influence of the magnetic field $B_o$, the aligned magnetic moments precess about the axis of the field at a frequency which is dependent on the strength of the applied magnetic field and on the characteristics of the nuclei. The angular precession frequency, $\omega$, also referred to as the Larmor frequency, is given by the Larmor equation $\omega = \gamma B$, in which $\gamma$ is the gyromagnetic ratio (which is constant for each NMR isotope) and wherein B is the magnetic field ($B_o$ plus other fields) acting upon the nuclear spins. It will be thus apparent that the resonant frequency is independent on the strength of the magnetic field in which the sample is positioned.

The orientation of magnetization M, normally directed along the magnetic field $B_o$, may be perturbed by the application of magnetic fields oscillation at or near the Larmor frequency. Typically, such magnetic fields designated $B_1$ are applied orthogonal to the direction of the $B_o$ field by means of RF pulses through a coil connected to radio-frequency-transmitting apparatus. Under the influence of RF excitation, magnetization M rotates about the direction of the $B_1$ field. In NMR studies, it is typically desired to apply RF pulses of sufficient magnitude and duration to rotate magnetization M into a plane perpendicular to the direction of the $B_o$ field. This plane is commonly referred to as the transverse plane. Upon cessation of the RF excitation, the nuclear moments rotated into the transverse plane precess around the direction of the static field. The vector sum of the spins forms a precessing bulk magnetization which can be sensed by an RF coil. The signals sensed by the RF coil, termed NMR signals, are characteristic of the magnetic field and of the particular chemical environment in which the nuclei are situated. In NMR imaging applications, the NMR signals are observed in the presence of magnetic-field gradients which are utilized to encode spatial information into the signals. This information is later used to reconstruct images of the object studied in a manner well known to those skilled in the art.

In performing whole-body NMR studies, it has been found advantageous to increase the strength of the homogeneous magnetic field $B_o$. This is desirable in the case of proton imaging to improve the signal-to-noise ratio of the NMR signals. In the case of spectroscopy, however, this is a necessity, since some of the chemical species studied (e.g., phosphorus and carbon) are relatively scarce in the body, so that a high magnetic field is necessary in order to detect usable signals. As is evident from the Larmor equation, the increase in magnetic field B is accompanied by a corresponding increase in frequency and, hence, in the required resonant frequency of the transmitter and receiver coils. This complicates the design of RF coils which are large enough to accommodate the human body. One source of difficulty is that the RF field generated by the coil must be homogeneous over the body region to be studied to produce more uniform measurements and images. The production of uniform RF magnetic fields over large volumes becomes increasingly difficult at high frequencies owing to unwanted effects of stray capacitances between different parts of RF coils and between RF coils and surrounding objects or the NMR sample, itself, which limit the highest frequency at which the coil can be made to resonate.

Conventional RF coils employ either one turn or two turns in parallel to minimize the inductance and increase the resonant frequency. An example of a conventional two-turn coil is a so-called "saddle coil" which is discussed in greater detail hereinafter. The concentration of the resonant current in so few turns reduces the homogeneity of the $B_1$ field and homogeneity of the sensitivity to signals produced in different parts of the sample region. Moreover, the lack of symmetry between the position of the tuning capacitor and the stray capacitance of the single-turn coil lead to a non-uniform current distribution in the coil and a corresponding reduction in the uniformity of the $B_1$ field and signal sensitivity.

It is, therefore, an object of the invention to provide an RF coil capable of generating a substantially homogeneous $B_1$ field and which has substantially uniform signal sensitivity over the region of interest.

It is another object of the invention to provide an NMR RF coil which is operable to produce a circularly polarized field and which exhibits an improved signal-to-noise ratio.

It is still another object of the invention to provide an NMR RF coil having current and tuning capacitance distributed in many turns.

SUMMARY OF THE INVENTION

In accordance with the invention, there is provided an NMR radio-frequency coil having a pair of conductive loop elements spaced along a common longitudinal axis. Each of the loop elements includes a plurality of serially-connected capacitive elements spaced along the loop peripheries. A plurality of axial conductive elements electrically interconnect the conductive loop elements at points between adjacent ones of the serially-connected capacitive elements. In the "high-pass" embodiment of the RF coil, the axial conductive segments may be wires, conducting tubes or flat conductive tapes whose inherent inductance is needed for proper coil operation. A "band-pass" embodiment of the coil is realized by including capacitive elements in each of the axial conductive segments.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Many NMR systems have access to the sample space along the direction of the static magnetic field which is typically selected to be along the Z-axis of the Cartesian coordinate system. This is generally true of NMR systems which use superconducting magnets and is the case for nearly all human scale NMR imaging systems because of efficiency considerations. Therefore, the sample or human subject is inserted along the direction of the static field, and RF transmitting and receiving coils are often wound on cylindrical coil forms whose axes are parallel to the static field. The RF magnetic field must be perpendicular to the static RF magnetic field and thus perpendicular to the cylindrical coil form.

Figure 1A:
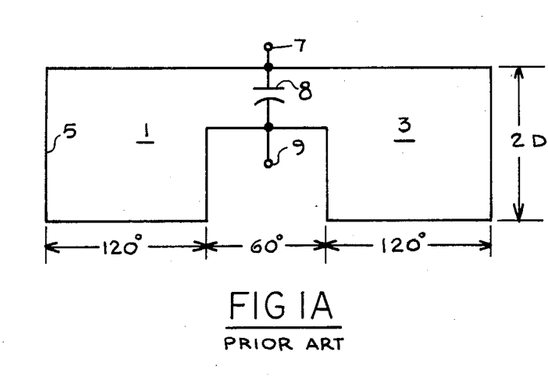
FIG. 1A illustrates in schematic form a conventional, parallel-connected, two-turn NMR RF coil used for whole-body studies.
Figure 1B:
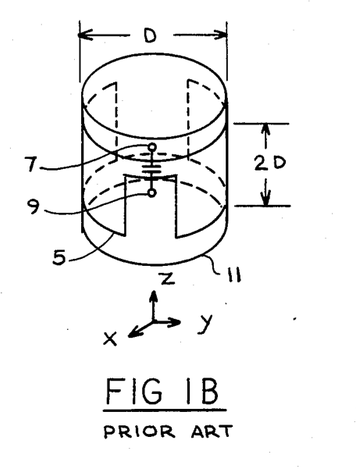
FIG. 1B depicts the coil illustrated in FIG. 1A mounted on a cylindrical form.

FIGS. 1A and 1B depict schematically a saddle-shaped RF coil of conventional design. The coil is made up of single turns 1 and 3 connected in parallel and driven at points 7 and 9 across a tuning capacitor 8. Such a coil is typically formed from copper tubing 5 which is mounted on a non-conductive (high dielectric) cylindrical form 11, as seen in FIG. 1B. Each of the coil turns is sized to cover 120° of the cylinder's circumference. The coil region where connections 7 and 9 are made is sized to cover approximately 60° of the circumference. For maximum RF field uniformity, the side of the coils parallel to the longitudinal axis of the cylinder should be equal to two cylinder diameters (D). However, a coil having a side length of two diameters is impractical, because RF energy is placed in regions of the patient which are not of interest. Therefore, in practice, the coil side length is reduced to approximately one diameter length.

Figure 1C:
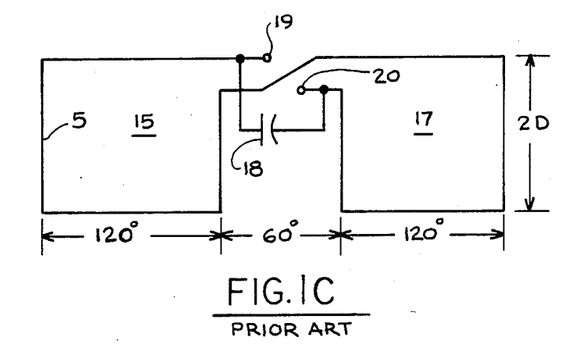
FIG. 1C depicts in schematic form another conventional two-turn, series-connected NMR RF coil used in NMR studies of the head, for example.

FIG. 1C illustrates another embodiment of a conventional RF coil which is similar to that depicted in FIG. 1A, but in which coil turns 15 and 17 are connected in series and driven at points 19 and 20 across a capacitor 18. The coil illustrated in FIG. 1C is typically utilized in NMR studies of the head.

In the case of each of the coils depicted in FIGS. 1A and 1C, the RF field produced is rather non-uniform and, therefore, undesirable for NMR imaging applications.

It is therefore apparent that current distribution needs to be controlled in a number of coil windings to produce a uniform $B_1$ field. Additionally, as already indicated hereinbefore, coil geometry should be such that there is free across along its longitudinal axis for positioning a patient or some other NMR sample. The $B_1$ field must also be perpendicular to the cylindrical axis of symmetry which is selected to be parallel to the direction of the $B_o$ field.

Figure 2A:
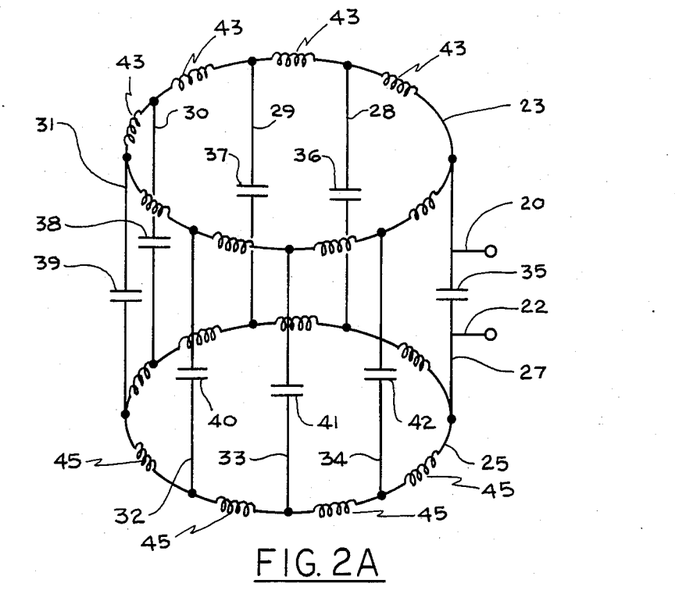
FIG. 2A depicts schematically an eight-section low-pass RF coil.
Figure 2B:
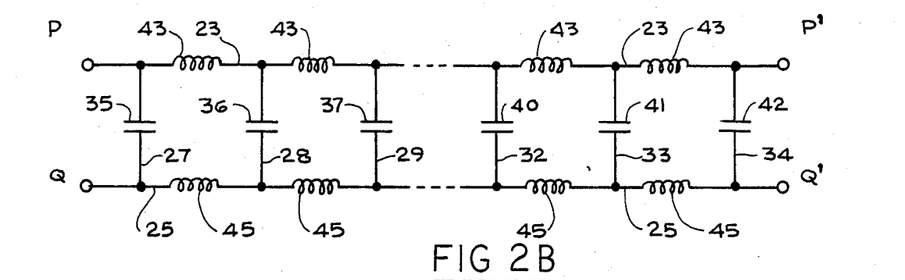
FIG. 2B depicts a lumped-element, low-pass, slow-wave delay line structure utilized in the coil depicted in FIG. 2A.

An improved RF coil, disclosed in greater detail and claimed in the afore-identified patent application, is schematically depicted in FIGS. 2A and 2B. Referring, first, to FIG. 2A, there is shown an eight-section exemplary embodiment of the RF coil comprised of two spaced-apart conductive loop elements 23 and 25 which are interconnected by eight axial conductive segments 27–34. Each of the conductive segments is provided with at least one capacitive element, such as those designated 35–42 corresponding, respectively, to capacitors in segments 27–34. Conductive loop elements 23 and 25 are each shown as having eight serially-connected inductive elements (in an eight-section coil) in loop sections between adjacent axial conductors. The inductive elements, generally designated by reference numeral 43 in loop 23 and 45 in loop 25, represent distributed inductances inherent in the conductors making up the loop elements. These inductances are needed for proper coil operation to achieve the desired phase shifts. The RF coil is excited by applying RF energy source (not shown) to leads 20 and 22 across an input capacitor (such as capacitor 35) in one of the conductive segments. The RF coil depicted in FIG. 2A is based on a lumped-element slow-wave delay line structure which is depicted in FIG. 2B, wherein like parts are assigned like reference numerals.

Referring now to FIG. 2B, conductive loop elements 23 and 25 are shown as straight conductors having a set of series-connected inductive elements 43 and 45, respectively. Similar inductances, of course, are also associated with conductive portions of segments 27-34; however, these are not depicted in FIG. 2B. In general, the inductances associated with conductive segments 27-34 represent a smaller effect than the capacitive effect associated with the discrete capacitive elements 34-42 associated with each of the segments. The RF coil depicted in FIG. 2A is formed by electrical joining ends P—P' and Q—Q' of conductors 23 and 25 (FIG. 2B), respectively. The RF coil shown in FIG. 2A and the corresponding lumped-element network shown in FIG. 2B are referred to as "low pass" because a low frequency signal will pass along the inductive elements, while a high frequency signal will tend to be blocked by the inductors and shorted out by the capacitors. Coils having a number of axial conductors both greater and lower than 8 are also possible, including coils having either even or odd number of axial conductors.

Figure 2C:
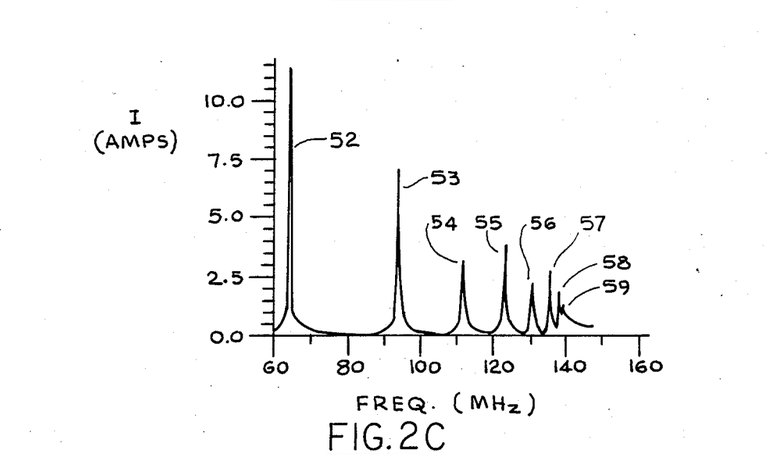
FIG. 2C is a graph illustrating calculated current versus frequency response in a circumferential inductor in a low-pass RF coil.

FIG. 2C depicts a calculated graph of the current (shown along the vertical axis in amperes) through one of the inductive elements in a conduction loop (such as 23 or 25 in FIG. 2A) versus frequency (shown along the horizontal axis in megahertz) as would be obtained in a 16-section embodiment of the low-pass RF coil similar to the eight-section coil depicted in FIG. 2A. For purposes of calculating the current, it is assumed that the coil is driven with an RF source across an inductor in one of the loop elements 23 or 25 in FIG. 2A. Each of the eight current peaks 52-59 in FIG. 2C represents two resonant modes of the RF coil. Current peak 52 corresponds to two orthogonal resonant modes occurring at approximately 64 MHz (the Larmor frequency of protons in a 1.5 tesla $B_o$ field) which are of particular interest in NMR imaging applications. Excitation of the coil at this frequency utilizing a suitable source of RF energy (not shown) will produce a current distribution in loop elements 23 and 25 proportional to $$\cos\left((k-1)\frac{2\pi}{16}\right) \quad (1)$$

where k=1 to 16 refers to the conductive segment number starting at the input inductor. The currents through the axial conductive segments will vary sinusoidally in accordance with $$\sin\left((k-1)\frac{2\pi}{16}\right), \quad (2)$$

where k=1 to 16, as defined before. The second resonant mode can be excited by energizing the RF coil at a second input inductor at right angles to the first.

Figure 3A:
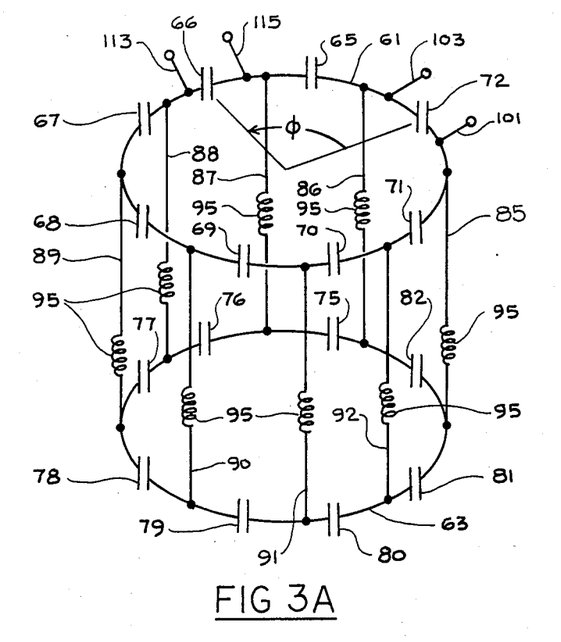
FIG. 3A depicts schematically an inventive eight-section high-pass RF coil.

An eight-section embodiment of the RF coil in accordance with the invention is depicted in FIG. 3A. In general, the overall configuration of the inventive coil is similar to the low-pass coil described with reference to FIG. 2A. Similarly, inventive coils having a number of sections greater than or less than 8 are contemplated within the scope of the invention. The inventive coil is made up of a pair of conductive loop elements 61 and 63 having, respectively, a plurality of serially-connected capacitors, such as those designated 65-72 and 75-82. Conductive loop elements 61 and 63 are electrically interconnected by eight generally parallel axial conductive segments 85-92. The conductive segments are spaced about the peripheries of the conductive loops and are positioned such that adjacent ones of the segments are separated by capacitive elements in each of the conductive loops. Each of the conductive segments 85-92 has associated therewith an inherent inductance which is needed for proper coil operation. This inductance is generally designated by reference numeral 95 in FIGS. 3A and 3B. As before, the coil is formed by joining ends R—R' of conductive element 61 and ends S—S' for conductive element 63 to produce the conductive loop elements.

Figure 3B:
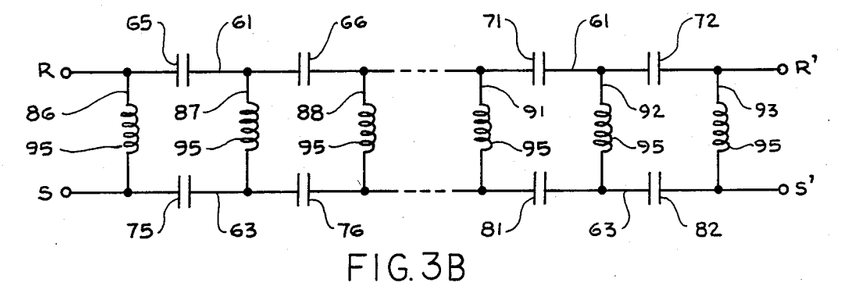
FIG. 3B depicts a lumped-element, high-pass, slow-wave delay line structure utilized in the coil depicted in FIG. 3A.

FIG. 3B shows a slow-wave "high-pass" ladder network structure so that the coil depicted in FIG. 3A is conveniently referred to as a high-pass RF coil. The term "high pass" refers to the fact that high frequency signals will tend to be passed by the capacitive elements in the conductive loops because at high frequency the capacitors will present a relatively low impedance compared to the inductors, which will present a relatively high impedance. Low frequency signals, conversely, will tend to be blocked by the capacitive elements which will present a relatively high impedance and shorted by the inductive elements which present a relatively low impedance The RF coil depicted in FIG. 3A has a number of resonant modes when excited by an RF power source (not shown) connected to leads 101 and 103 across an input capacitor 72. Only two of the resonant modes are of interest here. Specifically, the modes of interest are those in which the currents around the conductive loop elements are distributed in approximately Cos $\phi$ or Sin $\phi$ fashion, where $\phi$ is the azimuthal angle measured circumferentially around the coil, as indicated in FIG. 3A. Such sinusoidal currents produce a high uniform transverse magnetic RF field which is desirable for NMR measurement and imaging applications.

Figure 3C:
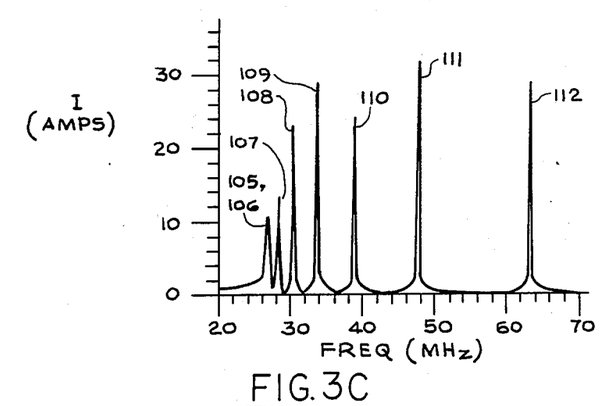
FIG. 3C is similar to FIG. 2C and depicts calculated current versus frequency response in a circumferential capacitor.

FIG. 3C is similar to FIG. 2C and depicts a calculated graph of the current in amperes, indicated along the vertical axis, through one of the capacitive elements in one of the conductive loops versus frequency in megahertz, as indicated along the horizontal axis. The particular coil configuration utilized to perform the calculations was a 16-section high-pass RF coil. One of the capacitive elements was selected as the input point and a 1 ampere input current applied thereacross. Each of the eight peaks 105-111 represents two resonant modes of the high-pass ladder coil. Peaks 105 and 106 have apparently run together due to lack of resolution in the plot. The peak designated 112, occurring at approximately 64 MHz is one of interest in NMR measuring and imaging applications of protons in a $B_o$ field of 1.5 tesla. Excitation of the coil at this frequency in the manner described hereinabove will produce a current distribution in the conductive loops proportional to $$\cos\left((k-1)\frac{2\pi}{16}\right) \quad (3)$$

where k=1 to 16 is the conductive segment number, starting with k=1 as the input capacitor. Thus, in FIG. 3A, capacitor 72 has been selected as the input capacitor, so that k=1 corresponds to conductive segment 86. The currents through the conductive segments 86-93 will vary according to $$\sin\left((k-1)\frac{2\pi}{16}\right), \quad (4)$$

where k is defined in the same manner. There is another orthogonal resonant mode at the same frequency which corresponds to exciting the RF coil across a second capacitor which is situated physically 90° around the conductive loop relative to the first input capacitor. In this case, the currents through the conductive loop elements and conductive segments are as above with k=1 corresponding to the second input capacitor.

Excitation of the RF coil in the manner described with reference to FIG. 3A at a single excitation point results in a linearly polarized $B_1$ RF field. This linearly polarized field can be decomposed into two counter-rotating vectorial components. One component rotates in the direction of the spin precession and can be effective in perturbing the spins. This is called the co-rotating component. The other component rotates in the direction opposite to the spin direction and can have no effect on perturbing the spins. This is called the counter-rotating component. Both components deposit power in the RF coil and NMR sample (or human imaging subject) by inducing eddy currents in the sample. Therefore it is apparent that if the RF coil can be made to create only the co-rotating component, then a saving of approximately a factor of 2 can be realized in the power dissipation compared to the power dissipated by linearly polarized RF magnetic field which produces the same effect on the nuclear magnetization. In this case, the RF field is said to be circularly polarized. The term quadrature excitation is applied to the technique used for exciting the coil so as to produce circular polarization.

Quadrature excitation and detection of the NMR signal can be achieved in a straight-forward manner using the inventive coil described with reference to FIG. 3A. This can be accomplished by exciting the coil at two input capacitors located at right angles relative to one another along the circumference of one of the conductive loop elements. Referring to FIG. 3A, this can be accomplished by exciting the coil as before across capacitor 72 at leads 101 and 103 and additionally exciting the coil at a second pair of leads 113 and 115 across a capacitor 66. Additionally, to achieve the desired circular polarization, the RF sources used to excite the coil at the two points must be electrically 90° out of phase relative to one another. That is, the phase of one of the sources must be proportional to $\cos \omega t$ and the phase of the other source proportional to $\sin \omega t$. In this manner, the two modes with approximately uniform transverse fields, as described above, are excited.

A further feature of the coil can be realized by utilizing multiple RF amplifiers (not shown) to energize the coil. Each amplifier is attached to a different input capacitor, and the signal through each amplifier is phased correctly to produce the desired RF excitation (i.e., linearly or circularly polarized). In this way the power requirement from each amplifier is reduced as compared to the requirement for driving the coil with one or two amplifiers. This may be particularly advantageous when high frequency solid-state transistors are used to produce RF power output, as it provides a simple way to combine the outputs of several circuits without using power combiners in the initial amplifier.

One example of the use of multiple RF sources to achieve circularly polarized excitation would be to use four RF amplifiers. Two of the amplifiers would be connected across capacitors 66 and 72, as shown in FIG. 3A. Two additional amplifiers would be connected across capacitors 68 and 70 at an angle $\phi = 180°$ and 270°, respectively. Electrically, the phases of the amplifiers are separated by 90° between adjacent amplifiers. For this example, the phases of the four RF amplifiers could be 0°, 90°, 180°, and 270°, for amplifiers connected at $\phi = 0°$, 90°, 180°, and 270°, respectively.

A simple example of utilizing multiple RF sources to achieve linear excitation would be to use two RF amplifiers connected across capacitors 72 and 68, FIG. 3A, ($\phi = 0°$ and 180°, repectively) and energized 180° out of phase relative to one another. A modification to use four amplifiers would be to connect two additional amplifiers across capacitors 78 and 82 in conductive loop 63, such that if the phase of these amplifiers is 0° and 180°, respectively, then the phase of amplifiers connected across capacitors 68 and 72 would be 180° and 0°, respectively.

It should be recognized that the multiple amplifier configurations described above are merely exemplary and many other combinations utilizing four or more amplifiers are possible.

The two orthogonal modes can also be used to receive the NMR signal due to the precession of magnetization M. Reception of the NMR signal in this manner provides an improvement in the signal-to-noise ratio by a factor of $\sqrt{2}$. Quadrature detection of the NMR signal can be accomplished by combining the received signals from leads connected across each of capacitors 72 and 66 in FIG. 3A, such that the resulting combined signal is a maximum for an RF magnetic field rotating in one direction within the coil and substantially zero for a rotating RF magnetic field in the opposite direction.

The inventive RF coil can be fabricated using any suitable construction technique. Head and body coils each having 16 axial conductive segments (16 sections) have been constructed for use at about 64 MHz. The head coil was constructed on a plexiglass coil form having an outside diameter of 0.28 m. and length of 0.4 m. In the head coil, the axial conductive segments are preferably formed from thin conductive copper tubing, but can also be made from either copper-clad printed circuit board or wire. Suitable copper tubing has been found to have 3 mm. (⅛ inch) outside diameter. An advantage in using tubing is that losses are minimized due to better current distribution. Another advantage is utilizing tubing in the construction of the head coil is that, due to the thinness of the tubing, large slots can be created in the coil form between adjacent conductive segments, thereby allowing good ventilation, as well as minimal visual obstruction for both the patient and operator. The conductive loop elements can be constructed from copper-clad, double-sided printed circuit board material utilizing, for example, Teflon resin as the substrate material which acts as the capacitor dielectric. The capacitor plates are comprised of overlapping conductive copper areas on opposite sides of the substrate. It may be desirable to form a plurality of discrete pads in one of the capacitor plates which can be bridged as necessary to increase or decrease the area of overlap between the plates thereby to increase or decrease the capacitance. A plurality of such capacitors are electrically interconnected in a loop to form the conductive loop elements. The capacitors for the head coil to resonate at 62.5 MHz have a value of about 95 picofarads (pF).

The body coil can be constructed in a manner similar to that described for the head coil. The axial conductive segments have been fabricated using 38 mm. wide copper tape on a cylindrical fiberglass coil form about 0.56 m. long and having an outside diameter of about 0.51 m. The coil itself is about 0.5 m. long. The capacitive elements were selected to be approximately 105 pF. Other body coils have been made in which copper tubing having an outside diameter of 6 mm. was used for the axial conductive segments.

Additional detail of the method of RF coil construction can be ascertained by reference to the aforeidentified related patent application which has been incorporated herein by reference.

By way of comparison, the inventive coil (ladder network coil) produces a significantly more uniform RF field than does the saddle coil. This is because the current distribution in the inventive coil, when it is excited in the desired mode, more closely approximates the ideal surface current distribution that gives a perfectly uniform transverse RF field. That is, a perfectly uniform $B_x$ field (RF field in the x-axis direction) would be produced by a coil which had a surface current density given by $$\lambda_\phi = 0 \qquad (5)$$

and $$\lambda_z = \frac{2B_x \sin(\phi)}{\mu_o} \qquad (6)$$

where $\lambda$ is the surface current density, $\phi$ is the azimuthal angle and $\mu_o$ is the permeability of free space.

In a practical coil it is necessary to provide return currents and to limit the coil to a finite length. In the finite length ladder network coil of N sections (e.g., 8 or 16), there are a number of resonant modes which produce a current distribution proportional to $$\cos \frac{2\pi M(k-1)}{N} \text{ or } \sin \frac{2\pi M(k-1)}{N}$$

where M is the resonant mode number and k is the section number (e.g., k=1 to k=8 or 16) starting from some reference point on the coil. The resonant mode with M=1 provides a good approximation to the desired sin ($\phi$) current distribution, and the major source of the residual inhomogeneity results from the finite length of the coil.

The field homogeneity of the ladder network coil can be compared to that of the saddle coil by evaluating the spherical harmonic expansion of the field produced by each coil. The field in the center of the coil can be represented as an expansion in spherical harmonics, e.g.;

$$B_x = \frac{\mu_o}{4\pi} \sum_{n,m} A_{n,m}^{xc} r^n P_n^m(\cos(\theta))\cos(m\phi), \qquad (7)$$

wherein r, $\theta$, and $\phi$ are the spherical polar coordinates of a point under consideration, superscript x designates the expansion in the direction of x axis, and where P is the associated Legendre function. In particular, the $B_1$ field at the center of the coil is $$B_x = \frac{\mu_o}{4\pi} A_{oo}^{xc} \qquad (8)$$

The coefficient $A_{oo}^{xc}$, which represents the homogeneous component of $B_1$, can be calculated by integrating over the currents on the coil surface. $A_{oo}^{xc}$ can then be expressed as $$A_{oo}^{xc} = \frac{4I\sqrt{3}}{a} \frac{K(K^2+2)}{(1+K^2)^{3/2}} \text{ for the saddle coil, and} \qquad (9)$$

$$A_{oo}^{xc} = \frac{2IN}{a} \sin\left(\frac{\pi}{N}\right) K(K^2+2) \text{ for the inventive coil,} \qquad (10)$$

with M=1. In Equations 9 and 10, K is the aspect ratio (ratio of length to diameter) of the coil, and N is the number of conductive segments in the coil and a is the radius of the coil form. For the inventive network coil, I represents the current in the first loop (i.e., in the capacitor with the largest current).

It is convenient to note that the currents in the ladder network coil can be represented as $$I_k^z = 2I \sin\left(\frac{\pi M}{N}\right) \sin \frac{\pi M(2k-1)}{N} \qquad (11)$$

and $$I_k^\phi = -I \cos \frac{2\pi M(k-1)}{N} \qquad (12)$$

where $I^z$ is the axial current, $I^\phi$ is the azimuthal current and M is the mode number. For coil operation as an NMR transmitter or receiver, a uniform transverse field which is given by the mode with M=1 is desired.

Figure 4A:
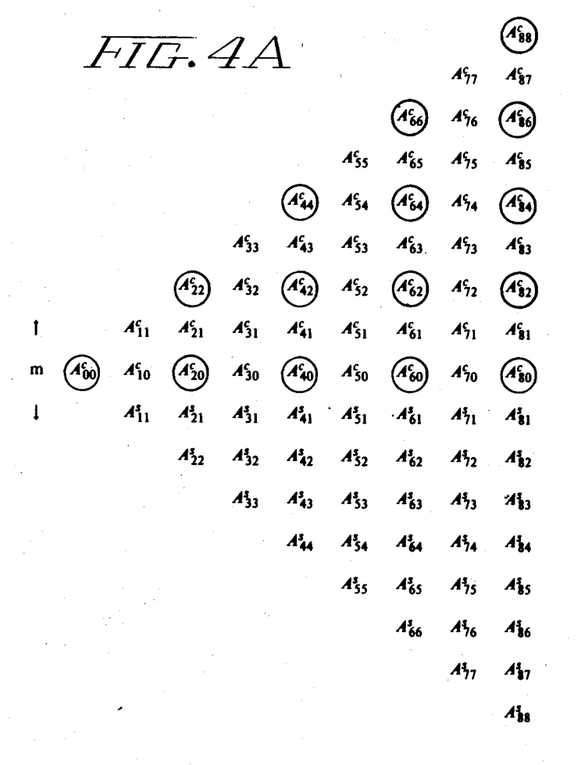
FIGS. 4A and 4B depict spherical harmonic coefficients for the expansion of RF fields produced by a conventional saddle coil and the inventive coil, respectively.
Figure 4B:
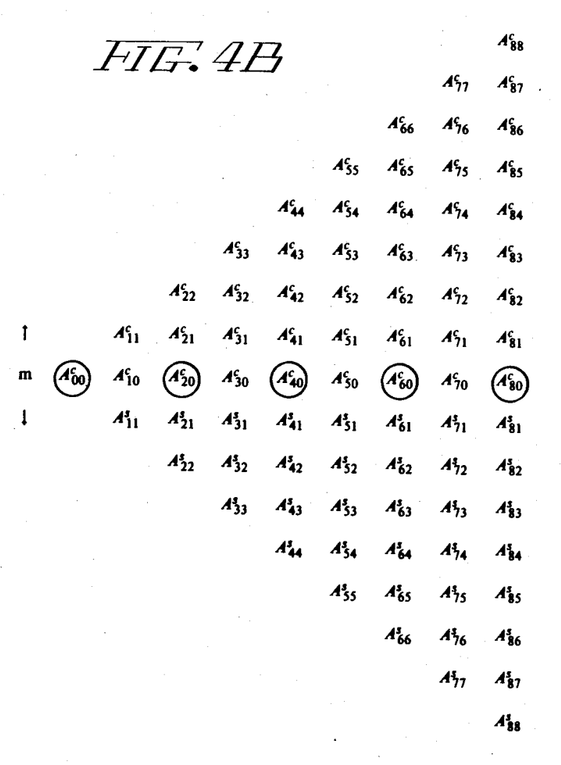
Figure 5A:
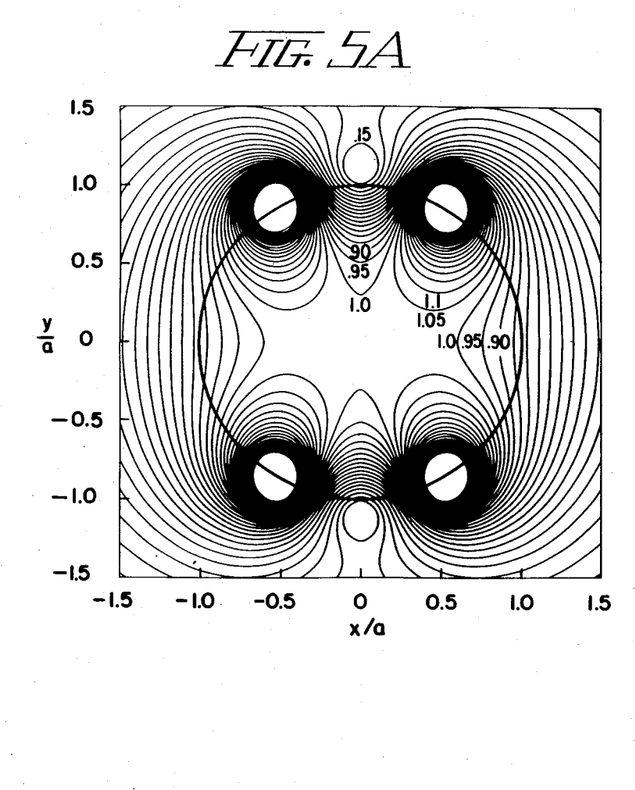
FIGS. 5A–5D are contour plots of constant RF field strength produced in a conventional saddle coil.
Figure 5B:
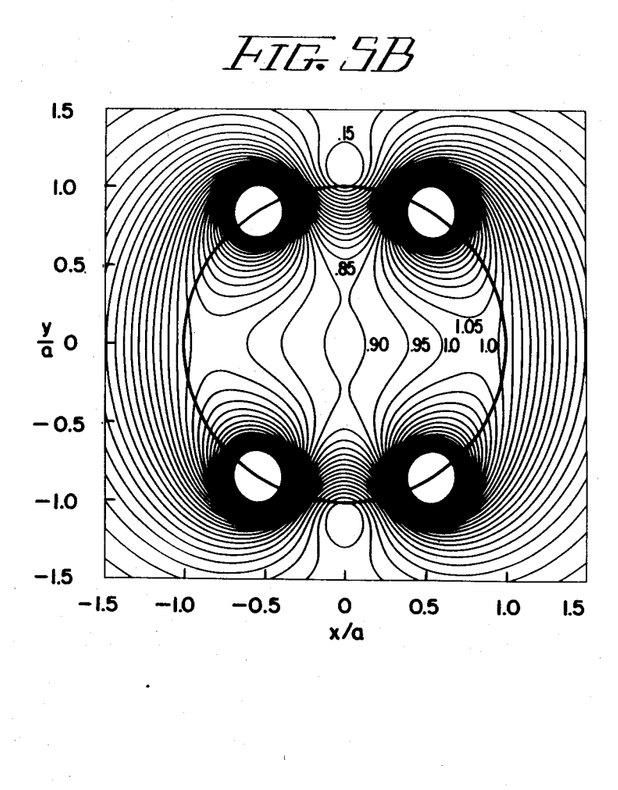
Figure 5C:
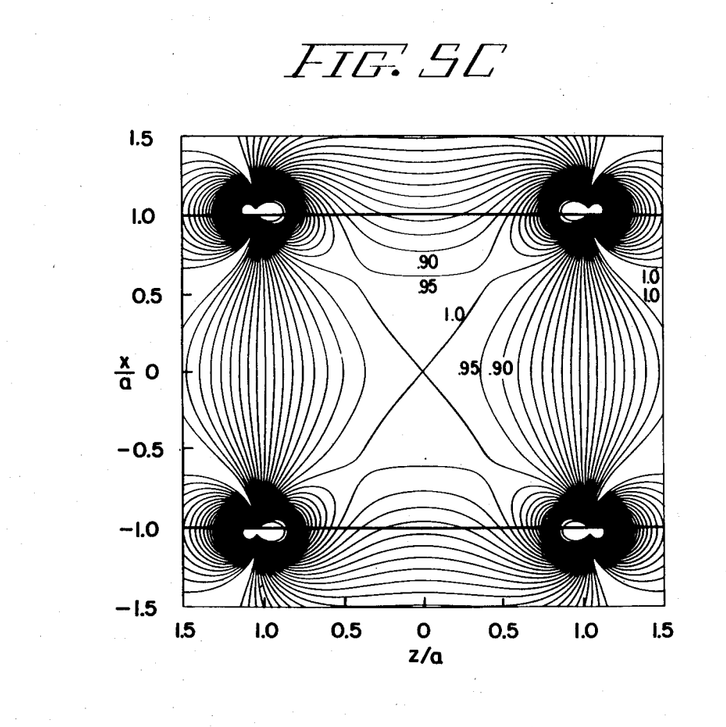
Figure 5D:
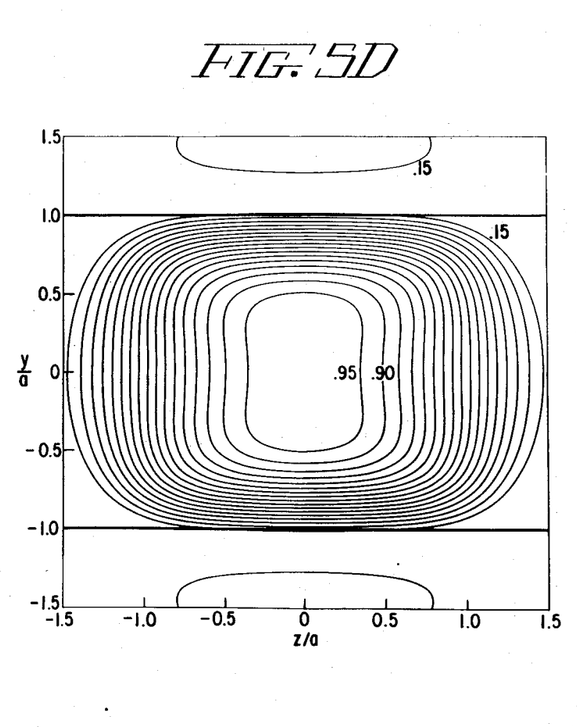
Figure 6A:
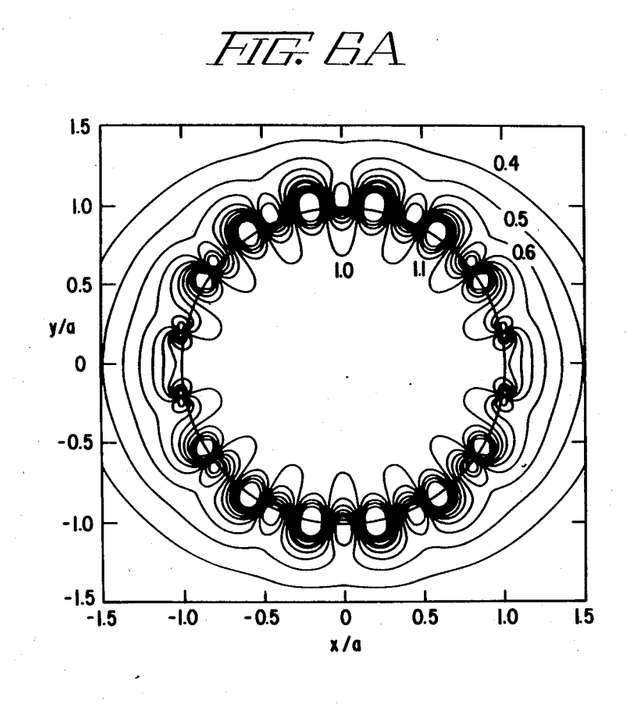
FIGS. 6A–6D are contour plots of constant RF field strength produced in a 16-section embodiment of the inventive coil.
Figure 6B:
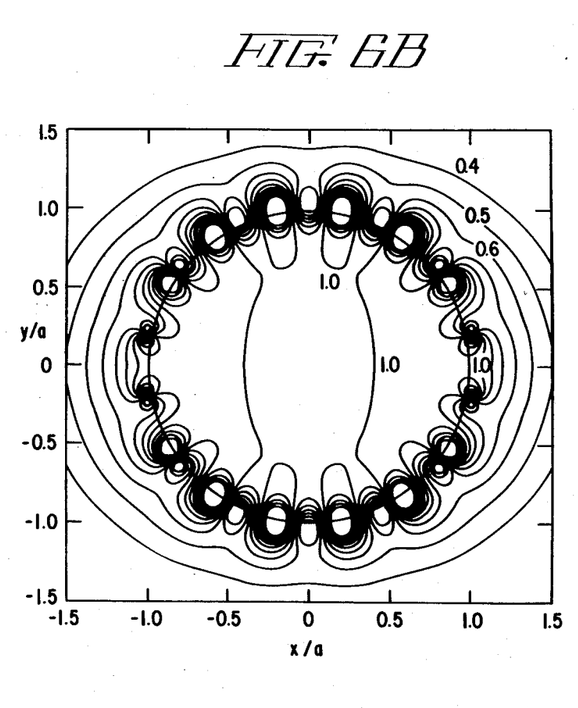
Figure 6C:
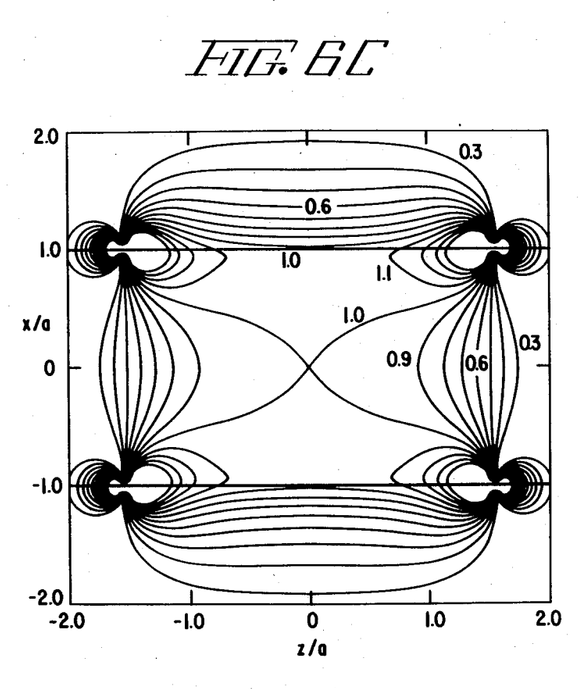
Figure 6D:
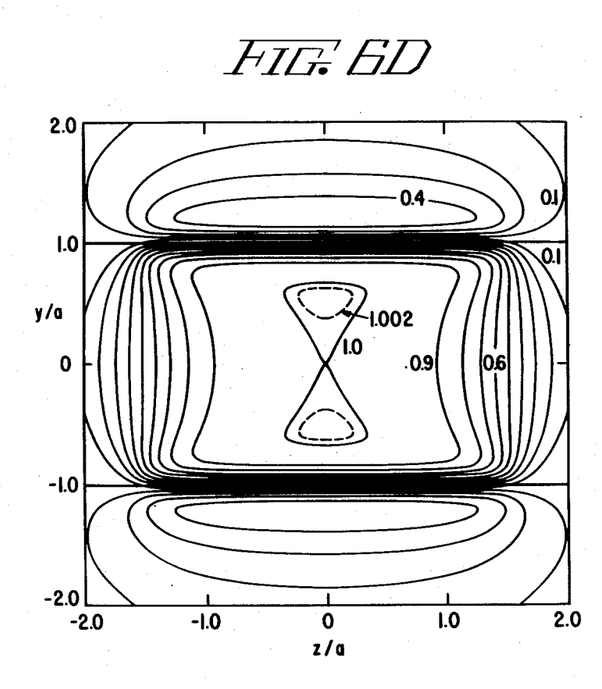

FIGS. 4A and 4B show all the coefficients necessary to completely express an arbitrary magnetic field in terms of a spherical harmonic expansion. Since a uniform, constant transverse field over the interior of the RF coil is desired, ideally only the term $A_{oo}^c$ should appear. However, since the current distribution in the saddle coil and the inventive finite ladder network coils of the invention are only imperfect approximations to the ideal sinusoidal current distributions, the resulting field is impure and the impurity is characterized by the appearance of other coefficients into the field expansion. In FIGS. 4A and 4B the undesired additional coefficients (representing the non-zero higher order components that contaminate the field) are circled. Thus, FIG. 4A shows the additional coefficients which appear in the expansion of the field produced by a saddle coil and FIG. 4B shows the additional coefficients for the field produced by a 16-section ladder network coil. It should be noted that the latter produces far fewer unwanted coefficients.

More specifically, FIG. 4A displays the higher order components that contaminate the field of the saddle coil. The inhomogeneities arise from two features; the finite length of the coil, and the fact that the current distribution is not perfectly sinusoidal. As K (aspect ratio) is increased, it can be shown that the contaminants of $B_x$ decrease to zero as $K \rightarrow \infty$ except the $A_{mn}{}^{xc}$ term with m=n. Thus, contaminants of the form $A_{22}{}^{xc}$, $A_{44}{}^{xc}$, $A_{66}{}^{xc}$... will be non-zero for a saddle coil even if the aspect ratio is arbitrarily large. It is noted in passing, that for the standard 120° arc for saddle coils, $A_{22}{}^{xc}$ will also approach zero as K is increased.

In terms of homogeneity, the ladder coil design has two advantages. First, as illustrated in FIG. 4B, for any values of K the coefficients $A_{nm}{}^{xc}$ will be zero unless m has the specific values m=0,2,14,16,18,30,32,24, ... (it has been assumed that N=16). This is a result of the sinusoidal distribution of current. Furthermore, as the aspect ratio is increased indefinitely, only terms of the form $A_{00}{}^{xc}$, $A_{16,16}{}^{xc}$, $A_{32,32}{}^{xc}$ and so on are non-zero.

FIGS. 5A-D and FIGS. 6A-D depict contour plots of constant, normalized RF field strength produced, respectively, in the saddle coil and in an inventive coil having 16 axial-conductive segments. In each case, the "A" Figures depict contour RF field strength in the transverse midplane of the coil. Figures designated "B" depict the field in a transverse plane located one-half radius from the coil is midplane, while the Figures designated "C" show the field in a plane passing through the cylindrical symmetry axis of the coil and containing the RF field. Finally, the Figures designated "D" depict contours of RF field strength in a plane which is perpendicular to the RF field and contains the cylindrical symmetry axis. It will be apparent from the spherical harmonic analysis set forth hereinabove and from FIGS. 5 and 6 that the inventive coil has a $B_1$ field of high homogeneity which is superior to the homogeneity produced by the saddle coil. As the aspect ratio is increased, the homogeneity and the advantage of the inventive coil over the saddle coil increases. Thus, if 1.0 represents a reference value of the field desired at the center of the coil, the field in the saddle coil deviates faster from this value in both the longitudinal and axial directions than does the inventive coil.

Figure 7:
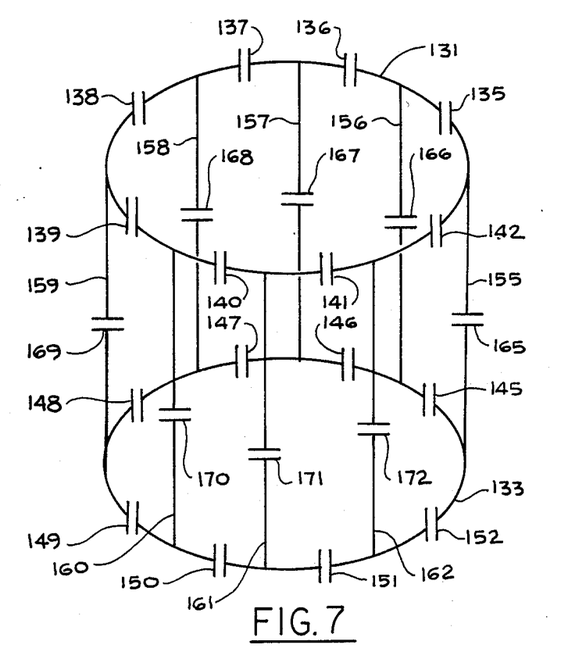
FIG. 7 depicts schematically another embodiment of the inventive RF coil referred to herein as the "band-pass" RF coil.

FIG. 7 depicts schematically another embodiment of the inventive RF coil which has some of the features of the low-pass and high-pass RF coils described hereinbefore with reference to FIGS. 2A and 3A, respectively. This embodiment of the coil, which will be referred to as a "band-pass" RF coil, is made up of two conductive loop elements 131 and 133. Conductive loop elements 131 and 133 are provided, as in the case of the high-pass coil, with a plurality of series-connected capacitors 135-142 and 145-152, respectively. As in the case of the low-pass coil, the conductive loop elements are interconnected by a plurality of axial conductive segments 155-162 which include a plurality of capacitive elements 165-172, respectively. Although this particular embodiment is depicted as having eight such axial conductive elements, as before, a number greater than or less than eight can be advantageously utilized in practicing the invention. Additionally, it should be recognized that the coil can be energized either by connecting an RF power source, not shown, across one of the capacitive elements in one of the conductive loops, or across one of the capacitive elements in one of the axial segments. Other excitation techniques disclosed hereinbefore are also applicable to the band-pass coil. It should be further understood that each of the conductive portions of either the conductive loop elements or the axial conductive segments has associated therewith an inherent inductance which, although not shown, is needed in order to achieve the correct degree of phase shift so as to produce the desired resonance conditions.

In the band-pass RF coil, the resonant modes are more compressed than in either the high-pass or low-pass coils. These modes align between a low-frequency limit at which both the axial and loop impedances are predominantly capacitive and a high-frequency limit at which both the axial and loop impedances are predominantly inductive. In the frequency band in which the modes reside, the capacitor values are such that the loop conductors are inductive while the axial segments are capacitive, or vice versa. The first case is analogous to the low-pass coil in that it is the lowest frequency modes of the set which produce an approximately uniform transverse RF magnetic field. When the capacitances are such that the axial segments are inductive while the circumferential segments are capacitive, then the highest frequency transverse modes are the ones that produce the uniform transverse fields, and this configuration is analogous to the high-pass RF coil.

The band-pass coil configuration may be useful in extending the slow-wave delay-line network coils to higher frequencies or to lessen the effects of stray capacitance coupling to the imaging subject or the surroundings. For example, using the high-pass coil as the basic configuration, capacitances can be inserted into the axial segments. These axial capacitors can be made to cancel some of the inductance of the axial segments, such that the total impedance of the axial segments is lessened. Then, for a given current, the voltage along the axial segment will be less than it was with no capacitors, and the current through stray capacitances will be less, thereby reducing losses and detuning effects associated with the stray capacitances.

From the foregoing, it will be appreciated that, in accordance with the invention, several embodiments of an RF coil are provided in which the current and tuning capacitance are distributed in many turns. The inventive NMR RF coils also provide a considerable improvement in the uniformity of the $B_1$ field and signal sensitivity. The geometry of the coils also permits improvements in signal-to-noise ratio and circularly polarized excitation.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. An NMR radio frequency (RF) coil comprising:
   a pair of conductive loop elements spaced along a common longitudinal axis, each of said conductive loop elements including a plurality of serially-connected capacitive elements spaced along the peripheries thereof; and
   a plurality of axial conductive segments electrically interconnecting said conductive loop elements at points between adjacent ones of said serially-connected capacitive elements.

2. The NMR RF coil of claim 1 wherein each of said axial conductive segments includes a capacitive element connected in series therewith.

3. The NMR RF coil of claim 1 further comprising a first means for exciting said RF coil across a first input capacitive element in one of said pair of conductive loops with a first RF power source oscillating at the frequency of the desired resonant mode so as to produce a current distribution proportional to $$\cos\left((k-1)\frac{2\pi}{N}\right)$$

in said conductive loop elements, and to produce current distribution which will vary according to $$\sin\left((k-1)\frac{2\pi}{N}\right)$$

ps through said axial conductive segments, wherein k is an integer between 1 and the total number of coil sections N, starting with k=1 at the section having the input capacitor.

4. The NMR RF coil of claim 3 further comprising a second means for exciting said RF coil across a second input capacitive element separated by 90° along the periphery of said one of the conductive loop elements from said first input capacitive element with a second RF power source at the frequency of the desired resonant mode, said power sources being electrically 90° out of phase relative to one another.

5. The NMR RF coil of claim 1 wherein said coil is constructed on a cylindrical coil form adapted for receiving therein an NMR subject and wherein said axial conductive segments comprise thin conductors so that large gaps are created between adjacent segments, said coil form having slots formed in the region of at least one of said gaps thereby to improve ventilation and visibility of the NMR subject.

6. The NMR RF coil of claim 1 wherein a plurality of said capacitive elements comprise input elements for an equal plurality of RF power amplifiers, the outputs of said amplifiers being phased relative to one another so that collectively the currents induced in said axial and loop conductive elements result in a linearly polarized RF magnetic field.

7. The NMR RF coil of claim 1 wherein a plurality of said capacitive elements comprise input elements for an equal plurality of RF power amplifiers, the outputs of said amplifiers being phased relative to one another so that collectively the currents induced in said axial and loop conductive elements result in a circularly polarized RF magnetic field.

8. An NMR radio frequency (RF) coil comprising a high-pass slow-wave delay line structure which is configured as a ladder network, said delay line structure being formed into a substantially cylindrical geometry and being connected to itself at its ends, wherein the side elements of the ladder network are coincident with the cylinder circumference, while the ladder rung elements are disposed lengthwise along the cylinder surface substantially parallel to the longitudinal axis of the cylinder.

9. The NMR RF coil of claim 8 wherein the side elements of the ladder network comprising a pair of conductive loop elements spaced along a common longitudinal axis, each of said conductive loop elements including a plurality of serially-connected capacitive elements spaced along the peripheries thereof, and wherein the ladder rung elements comprise a plurality of axial conductive segments electrically interconnecting said conductive loop elements at points between adjacent ones of said serially-connected capacitive elements.

10. An NMR radio frequency (RF) coil comprising a band-pass slow-wave delay line structure which is configured as a ladder network, said delay line structure being formed into a substantially cylindrical geometry and being connected to itself at its ends, wherein the side elements of the ladder network are coincident with the cylinder circumference, while the ladder rung elements are disposed lengthwise along the cylinder surface substantially parallel to the longitudinal axis of the cylinder.

11. The NMR RF coil of claim 10 wherein the side elements of the ladder network comprise a pair of conductive loop elements spaced along a common longitudinal axis, each of said conductive loop elements including a plurality of serially-connected capacitive elements spaced along the peripheries thereof, and wherein the ladder rung elements comprise a plurality of axial conductive segments electrically interconnecting said conductive loop elements at points between adjacent ones of said serially-connected capacitive elements, wherein each of said axial conductive segments includes at least one capacitive element connected in series therewith.

12. An NMR radio frequency (RF) coil comprising:
a pair of conductive loop elements spaced along a common longitudinal axis, each of said conductive loop elements including a plurality of serially-connected capcitive elements spaced along the peripheries thereof; and
a plurality of axial conductive segments electrically interconnecting said conductive loop elements at points between said serially-connected capacitive elements.

13. The NMR RF coil of one of claims 1, 8, 10 or 12 wherein said coil is constructed on a cylindrical coil form adapted for receiving therein an NMR subject, said coil form having a slot formed therein thereby to improve ventilation and visibility of the NMR subject.

14. The NMR RF coil of one of claims 9, 11 or 12 wherein a plurality of said capacitive elements in said conductive loop elements comprise input elements for an equal plurality of RF power amplifier, the outputs of said amplifiers being phased relative to one another so that collectively the currents induced in said axial and loop conductive elements result in a linearly polarized RF magnetic field.

15. The NMR RF coil of one of claims 9, 11 or 12 wherein a plurality of said capacitive elements in said conductive loop elements comprise input elements for an equal plurality of RF power amplifiers, the outputs of said amplifiers being phased relative to one another so that collectively the currents induced in said axial and loop conductive elements result in a circularly polarized RF magnetic field.

16. The NMR RF coil of one of claims 9, 11 or 12 further comprising a first means for exciting said RF coil across a first input capacitive element in one of said pair of conductive loops with a first RF power source oscillating at the frequency of the desired resonant mode so as to produce a current distribution proportional to $$\cos\left((k-1)\frac{2\pi}{N}\right)$$

in said conductive loop elements, and to produce current distribution which will vary according to $$\sin\left((k-1)\frac{2\pi}{N}\right).$$

17. The NMR RF coil of claim 16 further comprising a second means for exciting said RF coil across a second input capacitive element separated by 90° along the periphery of said one of the conductive loop elements from said first input capacitive element with a second RF power source at the frequency of the desired resonant mode, said power sources being electrically 90° out of phase relative to one another.

* * * * *

UNITED STATES PATENT AND TRADEMARK OFFICE
CERTIFICATE OF CORRECTION

PATENT NO. : 4,680,548
DATED : July 14, 1987
INVENTOR(S) : William A. Edelstein et al.

It is certified that error appears in the above-identified patent and that said Letters Patent is hereby corrected as shown below:

Col. 1, line 60, change "independent" to --dependent--.

Col. 4, line 49, change "across" to --access--.

Col. 6, line 66, after "is" insert --the--.

Col. 11, line 19, change "24" to --34--.

Col. 13, line 21, delete "ps".

Signed and Sealed this

Twenty-fifth Day of October, 1988

Attest:

DONALD J. QUIGG

Attesting Officer      Commissioner of Patents and Trademarks